United States Patent [19]

Rostoker et al.

[11] Patent Number: 5,777,374

[45] Date of Patent: *Jul. 7, 1998

[54] INTEGRATED CIRCUIT INTERCONNECT STRUCTURE WITH BACK REFLECTION SUPPRESSING ELECTRONIC "SPEED BUMPS"

[75] Inventors: Michael D. Rostoker, Boulder Creek; Nicholas F. Pasch, Pacifica, both of Calif.

[73] Assignee: LSI Logic Corporation, Milpitas, Calif.

[*] Notice: The term of this patent shall not extend beyond the expiration date of Pat. No. 5,442,225.

[21] Appl. No.: 578,324

[22] Filed: Dec. 26, 1995

Related U.S. Application Data

[63] Continuation of Ser. No. 483,113, Jun. 7, 1995, Pat. No. 5,567,988, which is a continuation-in-part of Ser. No. 106,175, Aug. 13, 1993, Pat. No. 5,422,225.

[51] Int. Cl.$^6$ .................. H01L 29/00; H01L 23/58; H01L 23/48; H01L 23/52

[52] U.S. Cl. .................. 257/533; 257/538; 257/664; 257/665; 257/754; 257/760

[58] Field of Search .................. 257/533, 538, 257/664, 665, 754, 760

[56] References Cited

U.S. PATENT DOCUMENTS

| | | | |
|---|---|---|---|
| 5,442,225 | 8/1995 | Rostoker et al. | 257/538 |
| 5,567,988 | 10/1996 | Rostoker et al. | 257/754 |

Primary Examiner—Ngân V. Ngô
Attorney, Agent, or Firm—Oppenheimer Wolff & Donnelly LLP

[57] ABSTRACT

A polysilicon interconnect is formed on a microelectronic circuit substrate for conducting signals from a driver to a non-polycrystalline silicon contact which has higher impedance than the interconnect. A plurality of electronic "speed bumps" are spaced along the interconnect for disturbing or disrupting signals propagating along the interconnect toward the contact and thereby reducing undesirable back reflection and ringing. The speed bumps can include capacitance altering elements in the form of dielectric strips, or resistance altering elements in the form of low resistance doped areas or high resistance amorphous areas. The speed bumps can include first and second elements having different values of capacitance or resistance which are spaced along the interconnect in alternating relation.

21 Claims, 6 Drawing Sheets

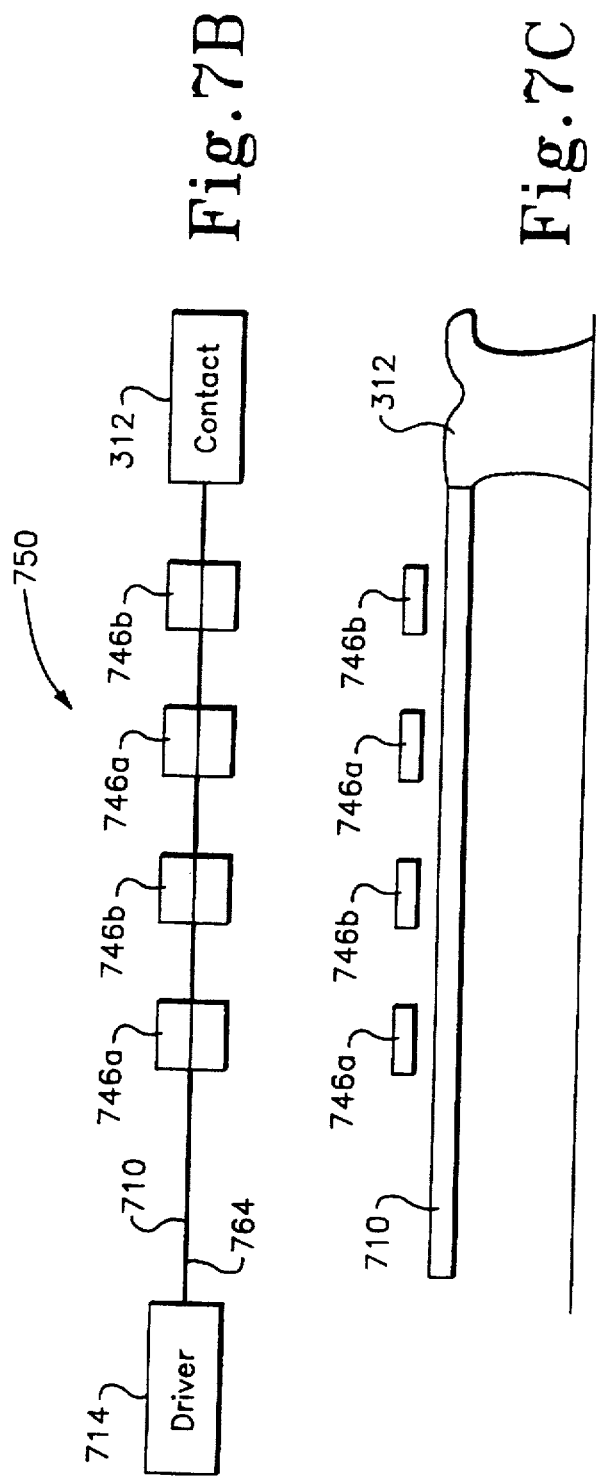
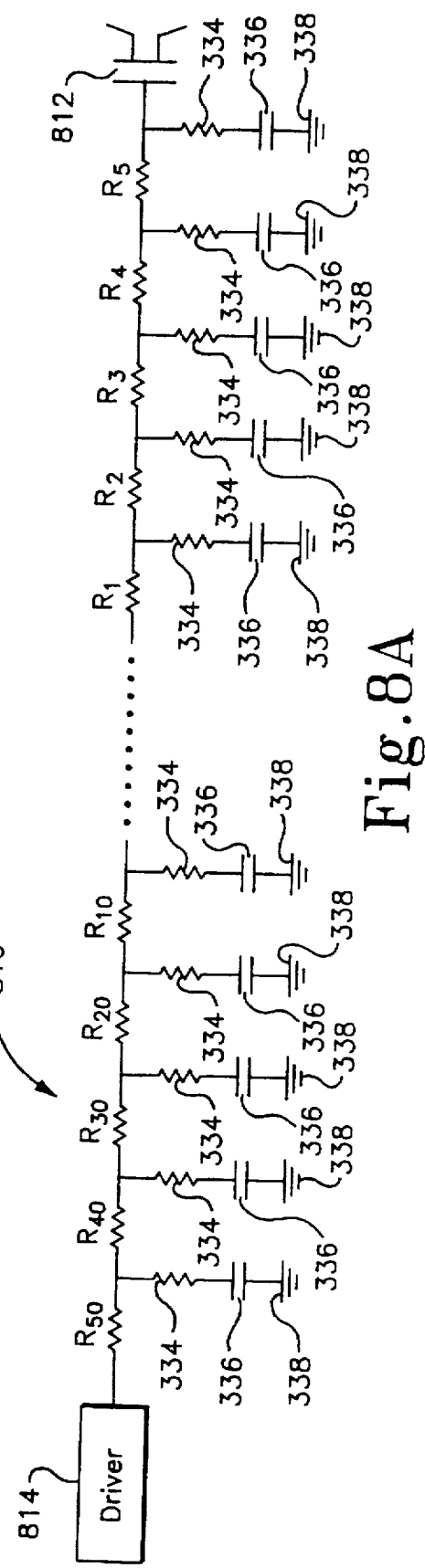
Fig.7B
Fig.7C
Fig.8A

INTEGRATED CIRCUIT INTERCONNECT STRUCTURE WITH BACK REFLECTION SUPPRESSING ELECTRONIC "SPEED BUMPS"

This application is a continuation of U.S. patent application Ser. No. 08/483,113, filed Jun. 7, 1995, now U.S. Pat. No. 5,567,988 which is a continuation-in-part of U.S. patent application Ser. No. 08/106,175, filed Aug. 13, 1993 now U.S. Pat. No. 5,442,225.

BACKGROUND OF THE INVENTION

1. Field of the Invention

The present invention generally relates to the art of microelectronic integrated circuits, and more specifically to an integrated circuit interconnect structure with back reflection suppressing electronic "speed bumps".

2. Description of the Related Art

High speed digital circuits, defined as those having digital pulses exceeding 1 Mhz, exhibit behavior significantly different than that seen in lower speed circuits. This behavior is illustrated in FIGS. 1A–1C to which reference is now made.

FIG. 1A illustrates an interconnect 10 connecting a driver 14 and an electrical contact 12, and FIGS. 1B and 1C are voltage vs. time graphs respectively illustrating a voltage pulse 16 produced by driver 14 and a resultant signal 17 at the interface between interconnect 10 and contact 12.

For example, pulse 16 may develop significant back reflection at the interface between the interconnect 10, made of metal or polysilicon, and the electrical contact 12, made of silicon. The back reflection propagates backwards along the interconnect 10, bouncing off the driver 14 and causing a ringing effect.

Furthermore, the back reflection propagates along any other interconnects (not shown) to which interconnect 10 may be connected. Thus, the back reflection causes spurious, uncontrollable noise throughout the integrated circuit in which interconnect 10 is located.

The back reflection also increases the effective "rise time" of the pulse arriving at contact 12. The original pulse 16 transitions from a first value of 0, such as might indicate an OFF state, to a second value of 1, such as might indicate an ON state, during a "rise time" of $T_1$, where $T_1$ is typically 500 pico sec. The pulse 17 (FIG. 1C) with the back reflection, on the other hand, has a much larger effective rise time, denoted $T_2$, on the order of 2 nanoseconds.

Thus, the back reflection reduces the maximum operating speed of the integrated circuit (since $T_2$ is larger than $T_1$), and adds significant, uncontrollable noise to the operation. In high speed circuits, such a situation is untenable, especially in circumstances of high ON/OFF switching speeds.

In a second example, illustrated in FIGS. 2A and 2B to which reference is now made, a driver 15 is connected to a receiver transistor 18 (FIG. 2A) via an interconnect 21. A second interconnect 22, located nearby, is connected to a second receiver transistor 24.

In certain situations, the two interconnects 21 and 22 are capacitively cross-coupled such that if a pulse 26 having a very sharp transition from 1V to 0V propagates along interconnect 21, it induces a similar pulse 28 in interconnect 22.

Receiver transistor 18 will transition in a normal manner from 1V to 0V. However, if receiver transistor 24 is already at 0V, the pulse along interconnect 22 will induce transistor 24 to transition to a negative voltage value, typically of −0.7V, which is the latched state. Once receiver transistor 24 is "latched up", it will not respond to any incoming signals.

The above described phenomenon is known as the "culprit-victim" problem, where interconnect 21 is the culprit and interconnect 22 is the victim, and is primarily caused by very sharp transitions. The sharp transitions also cause abrupt changes in the voltage level of the power supply because of the significant current demand of the transition.

SUMMARY OF THE INVENTION

It is therefore an object of the present invention to improve ON/OFF switching in high speed digital circuitry.

In accordance with the present invention, a polysilicon interconnect is formed on a microelectronic circuit substrate for conducting signals from a driver to a non-polycrystalline silicon contact which has higher impedance than the interconnect.

A plurality of electronic "speed bumps" are spaced along the interconnect for disturbing or disrupting signals propagating along the interconnect toward the contact and thereby reducing undesirable back reflection and ringing. The speed bumps can include impedance, such as capacitance altering elements in the form of dielectric strips, or resistance altering elements in the form of low resistance doped areas or high resistance amorphous areas.

The speed bumps can include first and second elements having different values of capacitance or resistance which are spaced along the interconnect in alternating relation.

In the first preferred embodiment, the speed bumps comprise capacitance altering elements which alter the capacitance, and thereby the capacitive loading of the interconnect. Preferably, the capacitance altering elements include a plurality of dielectric materials having differing dielectric constants located near the portion of the interconnect near the contact. For example, one or more strips of high dielectric material can be laid over the interconnect alternately with one or more strips of low dielectric material.

In the second preferred embodiment, the speed bumps comprise resistance altering elements which alter the resistance of the interconnect. Preferably, the resistance altering elements are formed by selectively doping portions of the interconnect and contact which, for this embodiment, are formed of polysilicon.

Applicants have realized that doping polysilicon reduces its resistance (e. g., increases its conductivity). Therefore, in one embodiment of the present invention, the doping is gradually reduced along the interconnect, with the most doping being furthest from the contact. In an alternative embodiment, the doping is reduced in steps. In a further embodiment, the doping is uniform over the interconnect and contact. Combinations of capacitive and resistance elements are also contemplated.

The second improvement concerns the culprit-victim problem. Applicants have realized that the capacitive cross-coupling is highly sensitive to high frequency signals and that the sharp transition pulse on the culprit interconnect contains therein many high frequency components.

Therefore, there is provided, in accordance with the present invention, apparatus for altering the impedance of the interconnects so as to filter out the highest frequency components of the pulse on the culprit interconnect.

In accordance with one embodiment of the present invention, the speed bumps include capacitance altering elements which alter the effective capacitance of the culprit interconnect. Preferably, the capacitance altering elements include depositions of a high dielectric constant material along at least a portion of the culprit interconnect.

The speed bumps alternatively include resistance altering elements. Preferably, the resistance altering elements include selectively doped portions of the polysilicon interconnect, similar to that described hereinabove. However, the doped portions are those portions nearest to the interface of the interconnect and the driver of the culprit interconnect.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 7B is a partial schematic, partially block diagram top view illustration of the capacitive speed bump arrangement of FIG. 7A;

FIG. 7C is a cross-sectional illustration of the speed bump arrangement of 7A;

FIG. 8A is a circuit diagram illustration of a resistive speed bump arrangement for reducing back reflection, constructed and operative in accordance with a second embodiment of the present invention;

DETAILED DESCRIPTION OF THE INVENTION

A system level device according to the present invention may specifically include Single-Chip-Modules (SCM), often including other electrical components (such as capacitors); Multi-Chip-Modules (MCM) having 2 or more integrated circuits with or without other electrical components; and board level products (BLP), such as those having multiple integrated circuits on a resin printed circuit or substrate board.

The invention further includes box level products ("Boxes"), which may include a combination of elements from the list of SCM, MCM, BLP, or other devices, and may also include a power supply.

Such system level devices specifically contemplated include digital (or other) memory storage systems, security systems, general purpose computers (such as personal computers, work stations, servers, mini computers, mainframe computers and super computers), transportation vehicles (such as airplanes, trains, automobiles, helicopters, rockets, missiles, boats, and submarines.

The contemplated system level devices further include subsystems for such vehicles, such as positioning (i.e. Global Positioning Systems (GPS)), display controllers, navigation, etc., entertainment systems (such as digital or other television, cameras, recorders, compact disc players/recorders, FM, AM, tape or other audio systems), communication systems such as "traditional" or cellular telephones, PBX, telephone switches, network controllers or encoder/decoders (i.e. token ring, Ethernet, etc.).

The contemplated devices yet further include subsystems or subassemblies for inclusion or attachment to such more complex system level products.

As used herein, the term "semiconductor device" refers to a silicon chip or die containing electronic circuitry and is more commonly referred to as a "semiconductor integrated circuit" or "integrated circuit." The term "semiconductor device assembly" or "integrated circuit assembly" refers to the silicon die and associated packaging containing the die, including conductive leads, such as ball bump, pins, surface mount gull wing and J leads, conductive tabs or balls at the periphery of a package and/or on the interior of a surface or the like, for connecting to a system circuit board, and internal connections of the die to the conductive leads such as bond wires, flip-chip or Tape Automated Bonding (TAB).

The term "semiconductor device assembly" or "integrated circuit assembly" may also refer to the silicon die and associated leadframe such as a tape carrier or package-less silicon die on a leadframe which may be encapsulated or not. The leadframe is connected to the package-less silicon die as is well known to those skilled in the art of semiconductor devices.

As described hereinabove, Applicants have realized that a major source of back reflection is the impedance mismatch between an interconnect and a silicon electrical contact. This is illustrated in FIG. 3 to which reference is now made.

Figure 3:
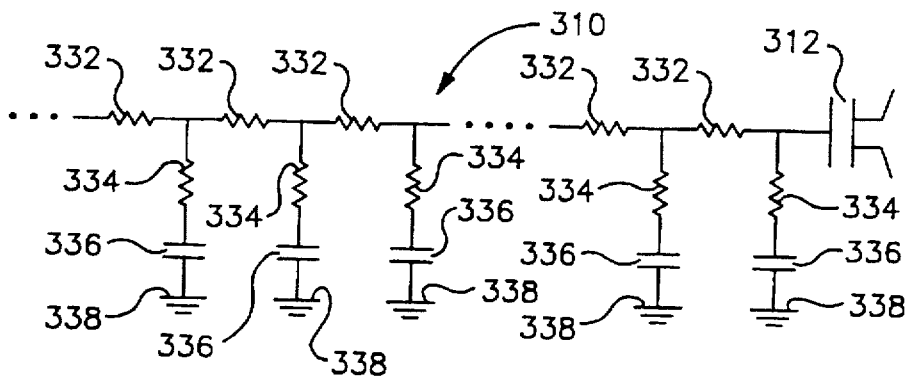
FIG. 3 is a circuit diagram illustration of a circuit model of a prior art interconnect.

FIG. 3 is a circuit diagram model for a prior art interconnect 310 connected to a contact 312. The interconnect 310 is modeled as being formed of a plurality of resistors 332 connected in series, each connected in parallel with a resistor 334 and a capacitor 336 connected to ground 338.

Thus, the interconnect 310 of the prior art has an impedance consisting of resistance and capacitive reactance.

Typically, in the prior art, circuits are designed to reduce the capacitance of the interconnect 310, thereby to increase the operating speed of the circuit.

In the prior art model, each resistor 332 and 334 typically has a resistivity of about 5 milli-ohm/micron, and the capacitors 336 have capacitances of 10 femto-farad, for a total capacitance of 200 fepto-farad. The contact 312 typically has a resistance of 1 ohm. A comparison of the two impedances indicates that they are considerably mismatched.

Figure 1A:
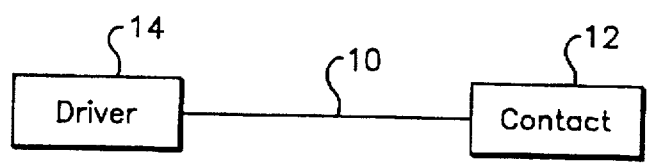
FIG. 1A is a schematic illustration of a prior art interconnect.
Figure 1B:
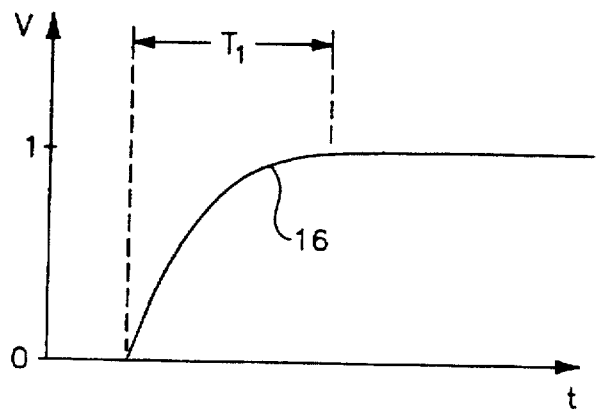
FIG. 1B is a graphical illustration of a pulse, useful in understanding the prior art.
Figure 1C:
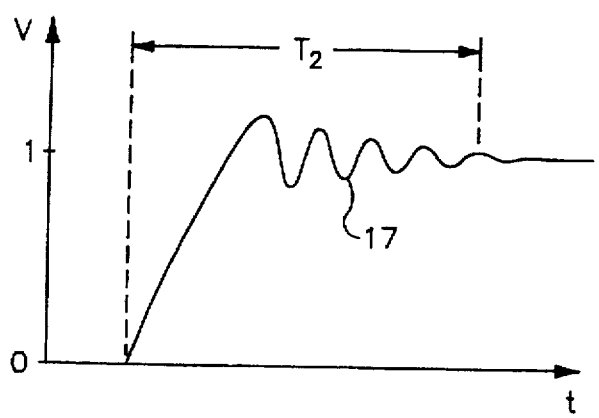
FIG. 1C is a graphical illustration of a back reflected pulse, useful in understanding the prior art.

At the contact 312, the higher impedance induces a series of phase delays into the pulse 16 (FIG. 1B) which causes the pulses 16 to no longer be coherent. This effect is the back reflection.

Mechanical "speed bumps" are elongated protrusions formed on residential streets and parking lots perpendicular to the direction of traffic flow to discourage persons from driving motor vehicles at high speeds in these areas.

Driving over a speed bump imparts an unpleasant jolt to the vehicle which encourages the driver to navigate the speed bump at a sufficiently low speed to minimize the intensity of the jolt. Drivers also realize that driving over a speed bump too fast can disrupt the wheel alignment of their vehicles and in extreme cases damage suspension components.

The object of a speed bump is to disturb or disrupt the smooth movement of the vehicle in order to achieve the desired goal of reduced traffic speed. This principle is embodied by the present invention electronically to reduce back reflection and ringing in a microelectronic interconnect structure by similarly disturbing or disrupting signals propagating along an interconnect toward a contact.

Applicants have realized that a major source of the back reflection is the mismatch in the impedance between the metal or polysilicon interconnect and the silicon electrical contact. Thus, the present invention provides "electronic speed bumps" for altering the impedance or capacitive loading of the interconnect. Several preferred embodiments for the present electronic speed bumps are provided hereinbelow.

Figure 4:
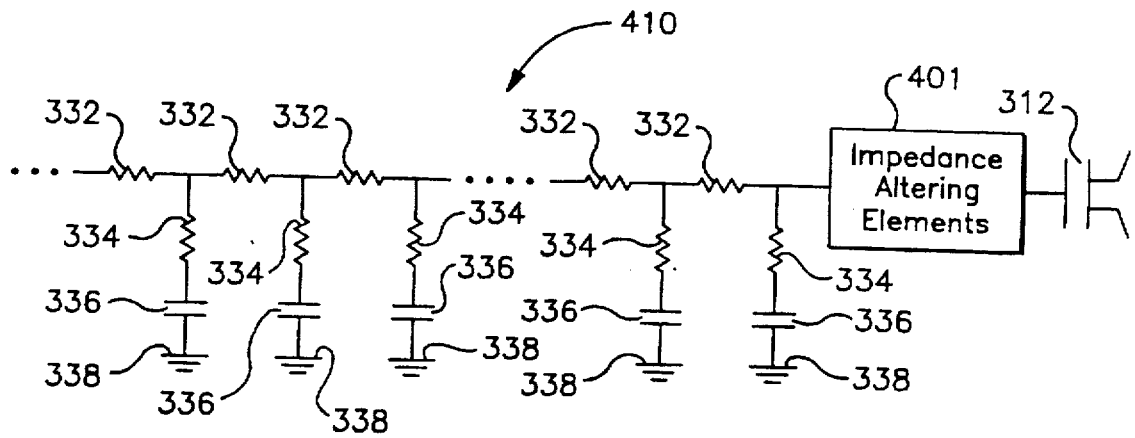
FIG. 4 is a partially schematic circuit diagram illustration of an interconnect and resistive speed bump arrangement, constructed and operative in accordance with the present invention.

The present invention, therefore and as illustrated in FIG. 4 to which reference is now made, comprises electronic speed bumps in the form of elements 401 for changing the impedance or capacitive loading of the interconnect, labeled 410. The specific elements and their connection to the interconnect will be described hereinbelow.

In first and second embodiments, elements 401 alter the resistance of the interconnect 410 to more closely match the impedance of the contact 312, or alter the capacitive loading of the interconnect 410, thereby reducing back reflections. Elements 401 can be placed on all interconnects 410 in the integrated circuit which interface with contacts, or on only some of them.

Figure 7A:
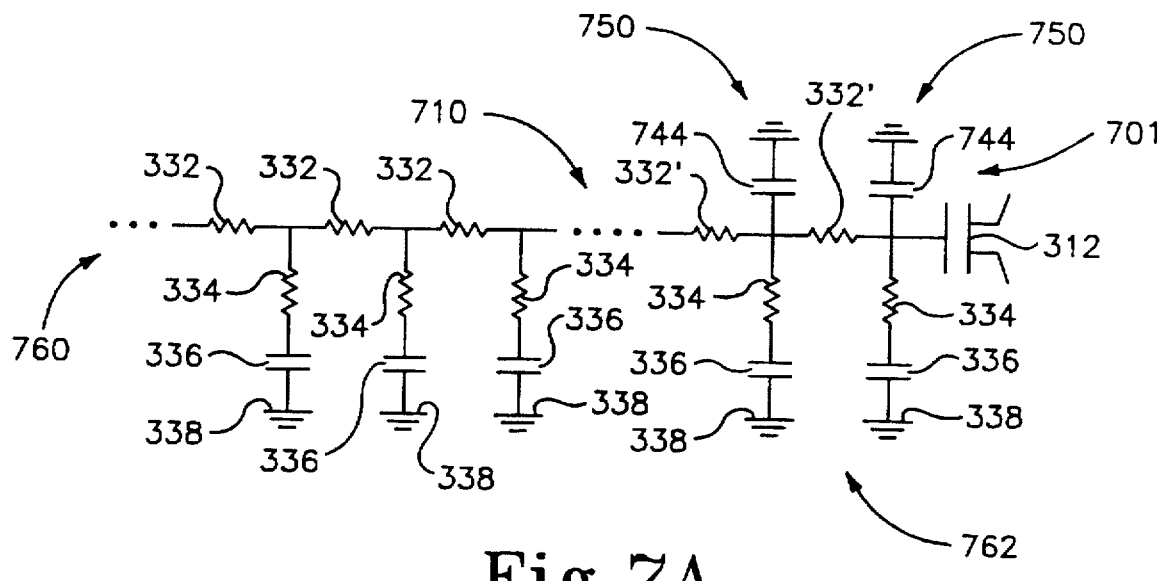
FIG. 7A is a circuit diagram illustration of a an interconnect and a capacitive speed bump arrangement for reducing back reflection, constructed and operative in accordance with a first embodiment of the present invention.
Figure 8B:
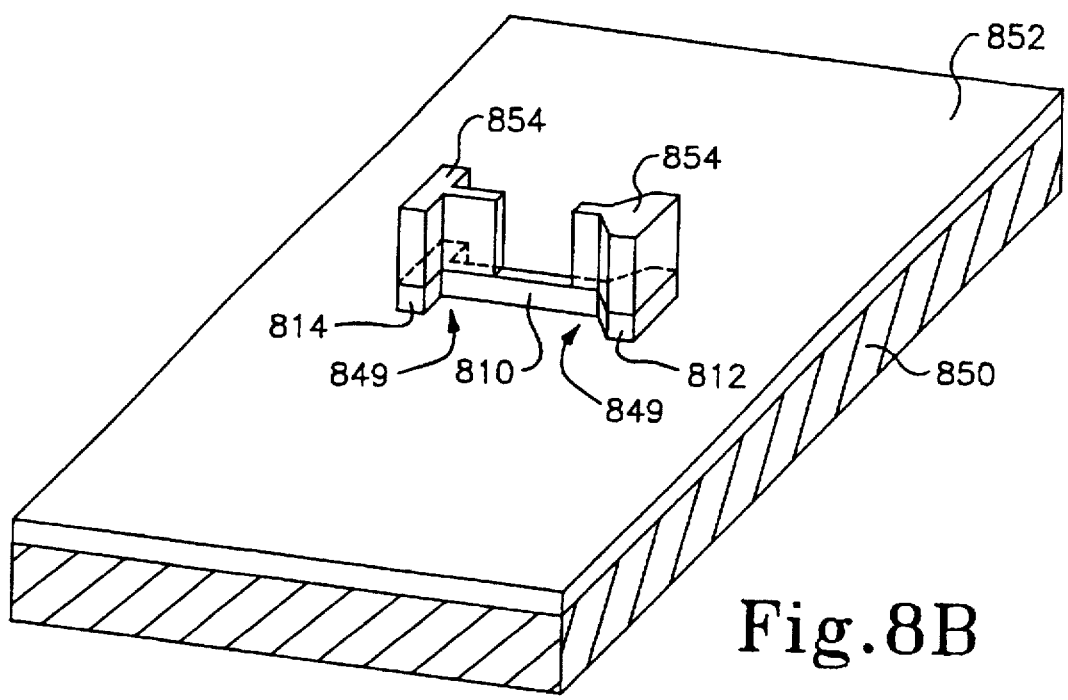
FIG. 8B is an isometric illustration of a step in the process of doping the interconnect in order to alter the resistance of the interconnect.

The first embodiment, described in detail with respect to FIGS. 7A–7C, increases the capacitive loading of the interconnect and the second embodiment, described in detail with respect to FIGS. 8A and 8B, increases the resistance of the interconnect.

Figure 5:
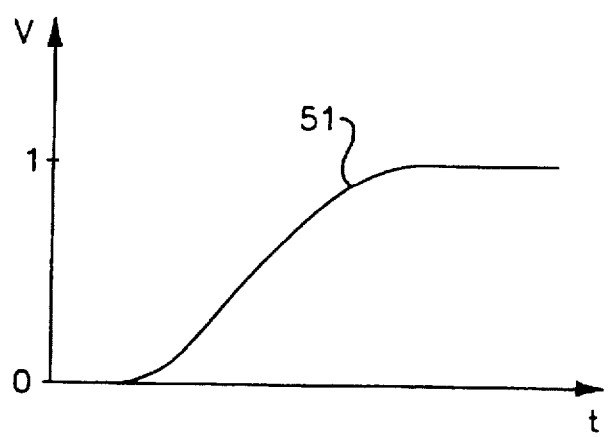
FIG. 5 is a graphical illustration of a pulse propagated along the interconnect of FIG. 4.

FIG. 5, to which reference is now briefly made, is a voltage-time graph illustrating a generalized resultant pulse 516 for the first two embodiments. Because the capacitive loading of the interconnect 410, in the area of the contact 312, is increased, the rate of voltage rise is decreased.

As long as the total rise time is $T_2$ or less, the maximum operating speed of the circuit of the present invention is no worse than that of prior art circuits operating in the presence of back reflections. However, with the more evenly matched impedances, there are little or no back reflections and thus, much less spurious noise in the integrated circuit.

As mentioned hereinabove, Applicants have realized that the capacitive cross-coupling is highly sensitive to high frequency signals and that the sharp transition pulse on the culprit interconnect contains therein many high frequency components.

Figure 2A:
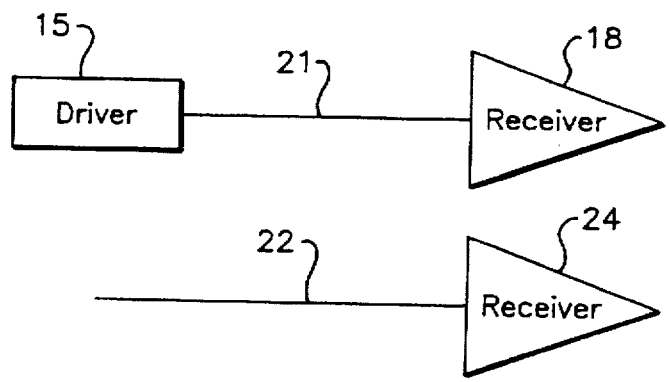
FIG. 2A is a schematic illustration of two cross-coupled prior art circuits.
Figure 9A:
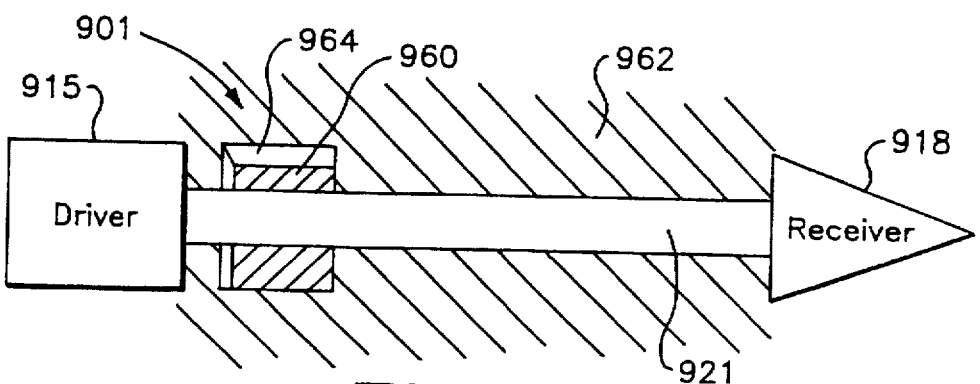
FIGS. 9A and 9B are top view, partially schematic, llustrations of two alternative capacitive bump arrangements for reducing fast initial rise times.
Figure 9B:
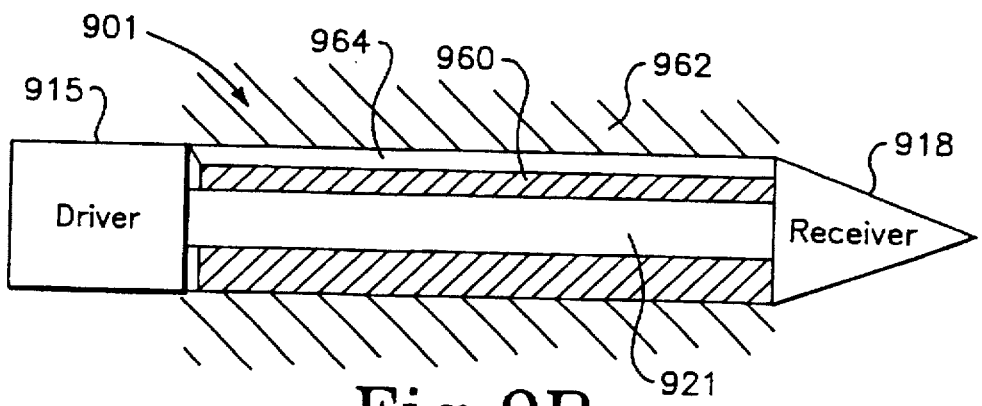

Therefore, in a third embodiment, described in detail with respect to FIGS. 9A and 9B, elements 401 increase the capacitive loading of the interconnect in order to reduce the high frequency components of the sharp transition pulse on the culprit interconnect 21 (FIG. 2A). Elements 401 can be placed on all culprit interconnects 21 or only on some of them.

Figure 6:
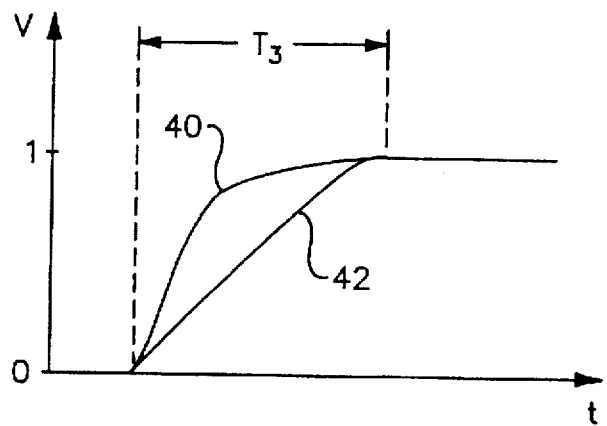
FIG. 6 is a graphical illustration of two pulses having two different rising rates, useful in understanding the prior art.

The shapes of a prior art transition pulse 40 and a present invention transition pulse 42 are illustrated in the voltage-time plot of FIG. 6 to which reference is now briefly made.

In circuits having the culprit-victim problem, the transitions from ON to OFF are typically relatively smooth. Typically, the prior art pulse 40, as it propagates along interconnect 21 (FIG. 2A), initially rises quickly to a value somewhat below the desired value (within, for example, 5%) and thereafter, slowly rises to the desired value. In total, the rise time is $T_3$.

In contrast, the present invention pulse 42 steadily rises toward the second value, wherein the total rise time is also $T_3$. Although both pulses have the same rise time, pulse 42 has fewer high frequency components to it and therefore, will cause less capacitive cross-coupling.

Reference is now made to FIGS. 7A–7B which illustrate the first embodiment wherein the speed bumps, labeled 701, comprise capacitance increasing elements 750 located close to the contact 312 for increasing the capacitive loading of the interconnect. In this embodiment, the interconnect, labeled 710, may be formed of metal.

As illustrated in FIG. 7A, the capacitance increasing elements 750 have the effect of adding a few capacitors 744 to the circuit model, connected in parallel to those resistors, labeled 332′, located near the contact 312. The capacitors 744 have little effect on the portion of the interconnect, labeled 760, furthest from the contact 312, thereby enabling a pulse to propagate relatively quickly along most of interconnect 710.

However, the capacitors 744 significantly affect the capacitive loading of interconnect 710 in an area 762 near the contact 312, raising the capacitive loading of interconnect 710 and thereby reducing the rate of voltage rise, as illustrated in FIG. 5. This decreases the rate of voltage change when receiving a signal pulse similar to the pulse 26 of FIG. 2B.

For example and as shown in FIG. 7B, the capacitance increasing elements 750 can be strips 746a and 746b of dielectric materials laid over the interconnect 710 and operative to alter the apparent dielectric constant of interconnect 710. The strips 746a,b can either be directly touching the interconnect 710 or a thin oxide (not shown) can be placed therebetween.

The strips 746a and 746b are typically selected to have differing dielectric constants and to alternate with one another, such that zones of differing capacitance and capacitive loading are created along the interconnect 710. In a preferred embodiment, the strips 746a are formed of silicon nitride, having a high dielectric constant and strips 746b are formed of silicon dioxide having a low dielectric constant.

It is noted that the capacitance increasing elements 750 can also be placed in an area 764 near the driver, labeled 714 (FIG. 7B).

The selection of types of materials, number of strips 746a,b and their thicknesses depend on the impedance of the contact 312 or driver 714 to be matched. The selection is typically performed with the help of a simulation program, such as SPICE.

Reference is now made to FIGS. 9A and 8B which illustrate a second embodiment of the present invention in which the speed bumps comprise resistance increasing elements. In this embodiment, the resistance increasing elements have the effect of providing those resistors near a contact 812, and a driver 814, with gradually increasing values.

In FIG. 8A, five resistors near the contact 812 are labeled $R_{1-5}$ and five resistors near the driver 814 are labeled $R_{10-50}$. In accordance with the present invention, the resistances increase (i.e., $R_1<R_2<R_3$ etc. and $R_{10}<R_{20}<R_{30}$ etc.) so as to gradually increase the impedance of the interconnect, labeled 810, to approach that of the contact 812.

The increased resistance, which is equivalent to decreased conductivity, can be formed as follows:

As shown in FIG. 8B, the interconnect 810, contact 812 and driver 814 are formed of polysilicon on a silicon substrate 850 at least partially covered with silicon dioxide 852. Applicants have discovered that a semiconductor, such as the intrinsic polysilicon of the interconnect 810, contact 812 and driver 814, can be doped with an ion implant so as to increase its conductivity.

Therefore, in accordance with the present invention, the interconnect 810, contact 812 and driver 814 can be selectively doped to provide a desired conductivity configuration. Such a conductivity configuration can be a gradual (smooth or stepped) decrease of conductivity near the interfaces of the interconnect 810 with either or both of driver 814 and contact 812 or it can be a uniform conductivity level for all elements.

In one embodiment of the invention and as illustrated in FIG. 8B, the doping is typically achieved as follows: areas, labeled 849, near contact 812 and driver 814 are first covered with a resist 854. The polysilicon interconnect 810 is then doped with an ion implant, such as phosphorous, an n-type dopant. The resist 854 is stripped and a second ion implant, also with phosphorous, is performed, implanting the interconnect 810, the contact 812 and the driver 814. The circuit is then heated and cooled to activate the dopant and to slightly spread it out.

Most of the interconnect 810 is thus implanted twice, providing it with a higher conductivity (e.g. lower resistance) than the areas 849 near the contact 812 and driver 814. Furthermore, due to the spreading of the dopant, there is a gradual increase of resistance near the interfaces of the interconnect 810 with the driver 814 and the contact 812.

Alternatively, the second ion implant can be a counter-doping implant, utilizing boron, a p-type implant.

To provide a uniform impedance level, only one implant is performed and no resist is placed on the contact 812 or driver 814.

Reference is now made to FIGS. 9A and 9B which illustrate a third embodiment of the present invention in which speed bumps, labeled 901, alter the impedance or capacitive loading in order to filter the high frequency components of a signal pulse such as pulse 40 shown in FIG. 6.

In contrast to the prior art in which the traditionally metal interconnect 20 of FIG. 2A is insulated with low dielectric constant materials such as deposited silicon dioxide, in the present invention, the culprit interconnect, labeled 921, is insulated with a high dielectric constant material 960, such as silicon nitride, laid into the low dielectric constant material, labeled 962.

The high dielectric constant material 960 can by deposited either uniformly along the entire length of the interconnect 921 from a driver 914 to a receiver 918, as shown in FIG. 9B, or only at an end 963 of the interconnect 921 near the driver 914, as shown in FIG. 9A.

Figure 2B:
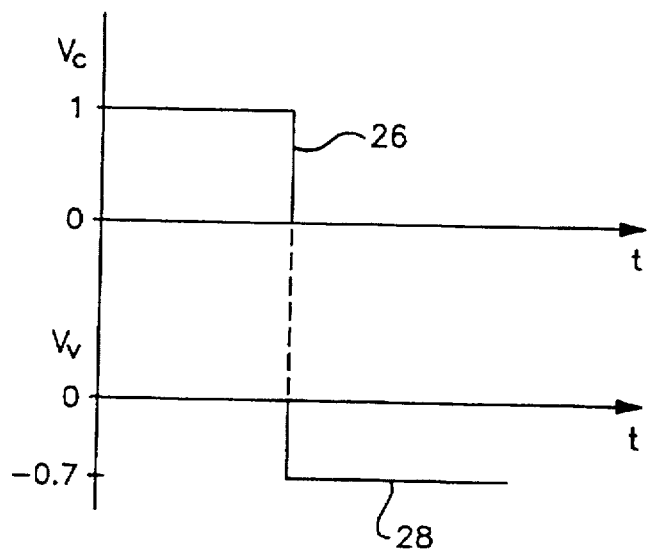
FIG. 2B is a graphical illustration of two pulses in the prior art circuit of FIG. 2A.

The introduction of a high dielectric constant material 960, in a controlled fashion, near the signal carrying culprit interconnect 921, has the effect of increasing the capacitive loading of the interconnect which, as desired, decreases its rate of voltage rise (i.e. its rate of voltage change) when receiving a signal pulse similar to pulse 26 of FIG. 2B.

The high dielectric constant material should be such that it does not affect the total rise time, but only the initial voltage rate of change.

The interconnects 921 of FIGS. 9A and 9B are manufactured by first cutting windows 964 into the low dielectric material 962, by methods well known in the art. The high dielectric constant material 960 is then deposited over the entire integrated circuit and etched back, removing those portions of material 960 not covering a culprit interconnect 921. The metal interconnect 921 is then deposited, cladding the remaining high dielectric material 960 portions and the low dielectric material 962.

It will be appreciated that the high dielectric material 962 and the metal interconnect 921 form a capacitor. If the capacitor has a small enough capacitance, it will filter out only the highest frequency components of the signal pulse (as pulse 40 shown in FIG. 6).

Alternatively although not shown, the impedance altering elements altering the impedance of the culprit interconnect 921 can be formed of resistance altering elements. The resistance altering elements are the same as those described with respect to the second embodiment illustrated in FIGS. 8A and 8B; however, in this alternative embodiment, the doping is placed only near the driver 914 of culprit interconnect 921.

Figure 10:
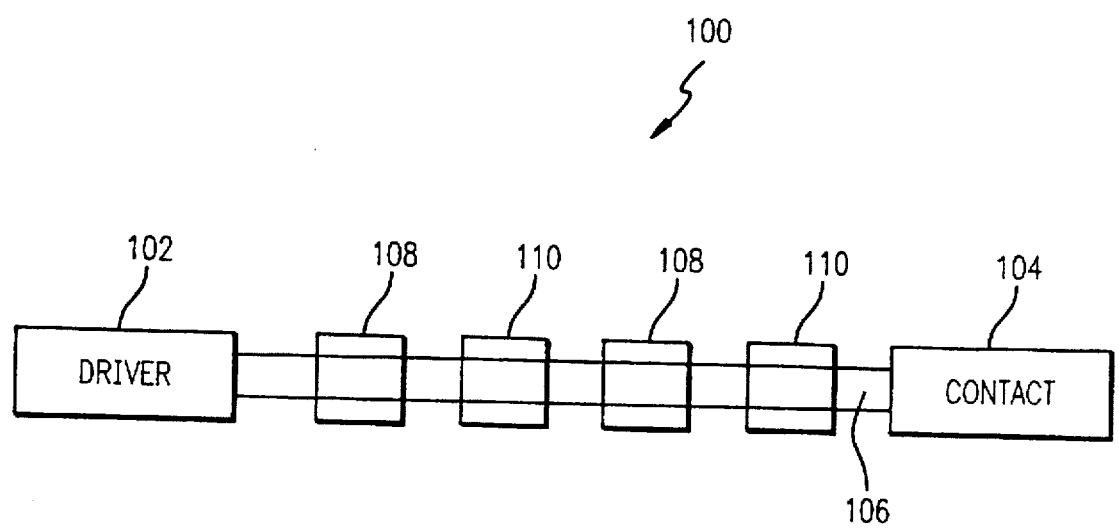
FIG. 10 is a diagram illustrating an alternative electronic speed bump arrangement including altered resistance areas.

FIG. 10 illustrates another embodiment of the invention in which the speed bumps comprise areas of different resistance formed in the interconnect. More specifically, a structure 100 embodying the present invention comprises a driver 102 which transmits signals to a silicon contact 104 via a polysilicon interconnect 106. The contact 104 can be formed of monocrystalline silicon which is highly doped to have low resistance, or any other type of non-polycrystalline silicon.

In the embodiment of FIG. 10, the electronic speed bumps comprises altered resistance areas 108 and 110 formed in the interconnect 106. The areas 108 and 110 can have the same resistance which is different from that of the remainder of the interconnect, or can have different respective values of resistance.

It will be understood that the areas 108 and 110, where provided with different values of resistance, are spaced along the interconnect in alternating relation. It is further within the scope of the invention to form all of the areas 108 and 110 with different values of resistance which vary in a non-progressive manner to disturb or disrupt signal flow through varying interaction.

The areas 108 and 110 can have higher resistance than the remainder of the interconnect 106. This can be accomplished, for example, by bombarding the areas 108 and 110 with ions, such as oxygen ions, which partially convert the areas 108 and 110 into amorphous silicon. This reduces the charge carrier mobility in the areas 108 and 110, thereby increasing the resistance to current flow.

The areas 108 and 110 can alternatively have lower resistance than the remainder of the interconnect 106 as described above. This can be accomplished by implanting the areas 108 and 110 with dopant ions such as phosphorous or boron to increase the number of charge carriers in the areas 108 and 110 and thereby reduce the resistance thereof by increasing conductivity.

As discussed above, the present invention can include any arrangement of speed bump elements with which signals interact and become disturbed or disrupted as they propagate along an interconnect. Providing alternating high and low resistance or capacitance areas such as described with reference to FIG. 10 causes the phase delay of the signals to vary locally and reduce the back reflection and ringing which result from a sharp impedance interface between the interconnect and contact.

Figure 11:
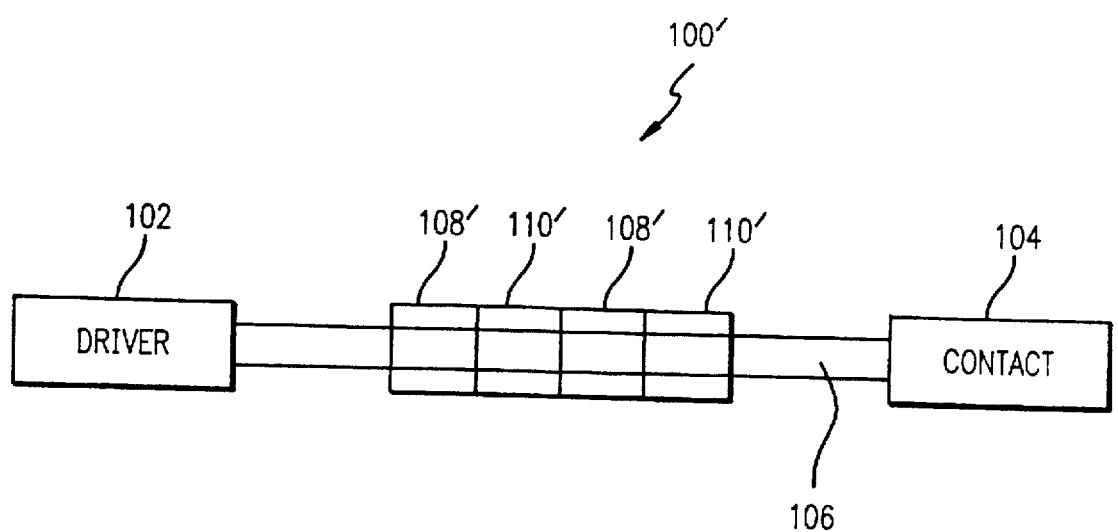
FIG. 11 is a diagram illustrating electronic speed bumps which are arranged substantially abut against each other.

Whereas the speed bumps in FIG. 10 are spaced from each other along the interconnect, FIG. 11 illustrates an arrangement which is applicable to both resistive and capacitive speed bumps in which the speed bumps substantially abut against each other. Like elements are designated by the same reference numerals used in FIG. 10, and corresponding but altered elements are designated by the same reference numerals primed.

In FIG. 11, speed bumps in the form of elements 108' and 110' are spaced along the interconnect 106 as described with reference to FIG. 10, but substantially no spaces are provided between adjacent elements. In this case, it is necessary that the elements 108' and 110' have different values of resistance or capacitance in order to disturb or disrupt signals propagating along the interconnect with alternating values of interaction.

It will be noted that if spaces are provided between the elements as in the structure 100 of FIG. 10, all of the elements 108 and 110 can be the same since the spaces between the elements will provide different signal interaction than the portions of the interconnect 106 whose capacitance or resistance is locally varied by the elements.

It will be appreciated by persons skilled in the art that the present invention is not limited to what has been particularly shown and described hereinabove. Rather the scope of the present invention is defined by the claims which follow:

Various modifications will become possible for those skilled in the art after receiving the teachings of the present disclosure without departing from the scope thereof.

We claim:

1. A microelectronic structure, comprising:
a semiconductor substrate having formed thereon at least one driver and at least one non-polycrystalline silicon contact, said contact having a first impedance;
an interconnect formed on the substrate for electrically coupling said driver to said contact, said interconnect having a second impedance substantially less than said first impedance; and
a plurality of signal altering elements spaced along the interconnect for substantially reducing back reflection and signal ringing at the interface of said interconnect and said contact.

2. A microelectronic structure including a semiconductor substrate having formed thereon at least one driver and one contact, comprising:
an interconnect formed on the substrate for electrically coupling said driver to said contact; and
a first signal altering element disposed on said interconnect for reducing back reflection and ringing in signals propagating along the interconnect; and a second signal altering element disposed on said interconnect for further reducing back reflection and ringing in signals propagating along the interconnect.

3. A microelectronic structure according to claim 2, wherein said first and second signal altering elements have different capacitance values.

4. A microelectronic structure according to claim 2, wherein said first and second signal altering elements have different resistance values.

5. A microelectronic structure according to claim 2, wherein said first and second signal altering elements alter the capacitive loading of the interconnect.

6. A microelectronic structure according to claim 2, wherein said first and second signal altering elements are dielectric strips.

7. A microelectronic structure according to claim 6, wherein the dielectric strips have different dielectric constants.

8. A microelectronic structure according to claim 2, wherein said contact has a first impedance and said interconnect has a second impedance.

9. A microelectronic structure according to claim 8, wherein said first impedance is substantially greater then said second impedance.

10. A microelectronic structure according to claim 2, wherein said interconnect is a polysilicon interconnect.

11. A microelectronic structure according to claim 2, wherein said contact is a non-polycrystalline silicon contact.

12. A microelectronic structure according to claim 2, wherein said first and second signal altering elements are both resistance altering elements.

13. A microelectronic structure according to claim 12, wherein said resistance altering elements are low resistance doped areas formed on said interconnect.

14. A microelectronic structure according to claim 12, further including a plurality of said first and second signal resistance altering elements spaced along the interconnect in altering relation.

15. A microelectronic structure according to claim 12, wherein said resistance altering elements are high resistance amorphous areas formed on said interconnect.

16. A microelectronic structure according to claim 7, wherein the dielectric strips are formed on the interconnect in close proximity to said contact.

17. A microelectronic structure according to claim 13, wherein the low resistance doped areas are formed of amorphous silicon.

18. A microelectronic structure according to claim 13, wherein the low resistance doped areas are formed by impurity doping.

19. A microelectronic structure according to claim 2, wherein said first and second signal altering elements are spaced from one another.

20. A microelectronic structure according to claim 2, wherein said first and second signal altering elements abut against each other.

21. A microelectronic device, comprising:
a semiconductor substrate;
a driver formed on said substrate;
a contact formed on said substrate;
an interconnect formed on said substrate for coupling together electrically said driver and said contact;
a first signal altering element disposed on said interconnect for reducing back reflection and ringing in signals propagating along the interconnect; and
a second signal altering element disposed on said interconnect for further reducing back reflection and ringing in signals propagating along the interconnect.

* * * * *